United States Patent
Shah (10) Patent No.: US 9,940,230 B2
(45) Date of Patent: Apr. 10, 2018

(54) COMPRESSION AND DECOMPRESSION OF DATA AT HIGH SPEED IN SOLID STATE STORAGE

(75) Inventor: Monish Shah, Dublin, CA (US)

(73) Assignee: CNEX Labs, Inc., San Jose, CA (US)

( * ) Notice: Subject to any disclaimer, the term of this patent is extended or adjusted under 35 U.S.C. 154(b) by 1136 days.

(21) Appl. No.: 13/880,728

(22) PCT Filed: Oct. 20, 2011

(86) PCT No.: PCT/IN2011/000725
§ 371 (c)(1),
(2), (4) Date: Apr. 20, 2013

(87) PCT Pub. No.: WO2012/053015
PCT Pub. Date: Apr. 26, 2012

(65) Prior Publication Data
US 2013/0290615 A1    Oct. 31, 2013

(30) Foreign Application Priority Data

Oct. 22, 2010   (IN) .......................... 2942/MUM/2010

(51) Int. Cl.
*G11C 7/10*       (2006.01)
*G06F 12/02*      (2006.01)
(Continued)

(52) U.S. Cl.
CPC ........ *G06F 12/0246* (2013.01); *G06F 3/0608* (2013.01); *G06F 3/0641* (2013.01);
(Continued)

(58) Field of Classification Search
CPC .. G06F 3/0679; G06F 3/0678; G06F 12/0246; G06F 2212/72; G06F 3/0608;
(Continued)

(56) References Cited

U.S. PATENT DOCUMENTS 5,603,001 A * 2/1997 Sukegawa ............. G06F 3/0601
                                                              711/103
5,689,255 A    11/1997 Frazier et al.
(Continued)

FOREIGN PATENT DOCUMENTS

AU          6765396        3/1997
DE         69633730       12/2004
(Continued)

OTHER PUBLICATIONS

Hongyuan Chen: "Joint Error Detection and VF Arithmetic Coding", 2001 IEEE International Conference Communications, Conference Record, Jun. 11, 2001, pp. 2763-2767, vol. 9.
(Continued)

*Primary Examiner* — Edward J Dudek, Jr.
*Assistant Examiner* — Andrew Russell
(74) *Attorney, Agent, or Firm* — James M. Wu; JW Law Group (57) ABSTRACT

Compression and decompression of data at high speed in solid state storage is described, including accessing a compressed data comprising a plurality of blocks of the compressed data, decompressing each of the plurality of blocks in a first stage of decompression to produce a plurality of partially decompressed blocks, and reconstructing an original data from the partially decompressed blocks in a second stage of decompression.

18 Claims, 5 Drawing Sheets

(51) Int. Cl.
*G06F 3/06* (2006.01)
*H03M 7/30* (2006.01)
*G11C 16/10* (2006.01)

(52) U.S. Cl.
CPC .......... *G06F 3/0679* (2013.01); *G11C 7/1006* (2013.01); *H03M 7/30* (2013.01); *H03M 7/3084* (2013.01); *G06F 2212/401* (2013.01); *G06F 2212/7202* (2013.01); *G06F 2213/0038* (2013.01); *G11C 16/10* (2013.01); *G11C 2207/102* (2013.01)

(58) Field of Classification Search
CPC ............. G06F 3/0641; G06F 2212/401; G11C 7/1006; G11C 2207/102; H03M 7/30; H03M 7/3084–7/3097; H03M 7/40–7/425
See application file for complete search history.

(56) References Cited

U.S. PATENT DOCUMENTS

| | | | | |
|---|---|---|---|---|
| 6,310,563 | B1* | 10/2001 | Har | H03M 7/3086 341/50 |
| 2004/0073710 | A1* | 4/2004 | Fallon | G06F 3/0608 709/247 |
| 2005/0104753 | A1* | 5/2005 | Dror | H03M 7/40 341/51 |
| 2008/0195810 | A1* | 8/2008 | Wu | G06F 11/1068 711/114 |
| 2009/0044231 | A1* | 2/2009 | Oh | H03M 13/271 725/62 |
| 2010/0079313 | A1* | 4/2010 | Gonion | H03M 7/40 341/60 |
| 2010/0088464 | A1* | 4/2010 | Yang | G06F 12/0246 711/103 |
| 2010/0223237 | A1 | 9/2010 | Mishra et al. | |

FOREIGN PATENT DOCUMENTS

| | | |
|---|---|---|
| DE | 69633730 | 2/2006 |
| EP | 0846373 | 6/1998 |
| JP | 2000516048 | 11/2000 |
| WO | WO 97/09665 | 3/1997 |
| WO | WO 9709665 | 3/1997 |
| WO | WO 2009/061814 | 5/2009 |

OTHER PUBLICATIONS

Chin-Hsing Chen et al: "The Real-Time Compression Layer for Flash Memory in Mobile Multimedia Devices", Mobile Networks and Applications, vol. 13, No. 6, Jul. 20, 2008, pp. 547-554, Kluwer Academic Publishers, BO.

* cited by examiner

COMPRESSION AND DECOMPRESSION OF DATA AT HIGH SPEED IN SOLID STATE STORAGE

CROSS-REFERENCE TO RELATED APPLICATIONS

The present Utility patent application claims priority benefit of the Indian provisional patent number 2942/MUM/2010, and entitled "Compression and Decompressive of Data at High Speed in Solid State Storage", filed on Oct. 22, 2010 under 35 U.S.C. 119(a). The present Utility patent application is the National Phase filing under 35 U.S.C. 371 of the International Application No PCT/IN2011/000725 filed Oct. 20, 2011 entitled "Compression and Decompressive of Data at High Speed in Solid State Storage". The contents of these related provisional and PCT applications are incorporated herein by reference for all purposes to the extent that such subject matter is not inconsistent herewith or limiting hereof.

FIELD

The present invention relates generally to computer software, computer program architecture, computer memory, and data storage and compression. More specifically, techniques for compression and decompression of data at high speed in solid state storage are described.

BACKGROUND

Hard disk based storage traditionally has been used to store computer data. Hard disk capacity has increased dramatically over the years; however, hard disk performance in terms of Input/Output Operations per Second (hereafter "IOPS") has scaled more slowly and has reached a saturation point. The terms "hard disk drive" and "hard disk" are used interchangeably herein to refer to computer-based non-volatile magnetic data storage.

Digital memories based on electronic circuitry perform faster than conventional hard disks. Thus, storing data in digital memory is an effective way to increase and improve upon the performance of hard disks. However, there are problems associated with conventional digital memory solutions. Traditionally, Dynamic Random Access Memory (DRAM) has been used to provide fast access to data. More recently, NAND Flash™ memory (hereafter "Flash" or "Flash chip") has surpassed DRAM in terms of cost and capacity and is becoming a popular choice for high performance storage. Flash memory is typically implemented as solid state storage, such as a solid state drive (SSD), which is packaged similar to a hard disk and has a similar interface and programming model.

On a cost per gigabyte (GB) basis, Flash is more expensive than hard disks. Therefore, it is desirable to save costs by compressing data before storing it in Flash, such that the data may be saved using less Flash memory. This also has the advantage of reducing the amount of data that needs to be written to Flash, which improves performance.

However, the challenge in introducing compression in solid state storage is that compression and decompression engines must process data at very high rates to achieve performance rates similar to those of Flash-based memories. This poses a challenge because compression and decompression algorithms are compute-intensive (i.e., require a large number of computing operations). Conventional software-based approaches, running compression and decompression algorithms in a host processor, are unlikely to be able to keep up with the performance requirements. Also, there are performance limitations with conventional dedicated hardware for compression and decompression. For example, an SSD implementation can require many Flash chips in parallel to read and write data at very high rates. Some Flash chips, such as those compliant with the Open NAND Flash Interface (ONFI) 2.0 specification, can supply data at rates of approximately 166 megabytes (MB) per second. Further, it is not uncommon to operate 16 to 24 such Flash chips in parallel, which results in data rates as high as 4 GB/s, which is difficult to approximate using conventional compression and decompression solutions. It is desirable to achieve decompression at rates approaching 4 GB/s, which conventional software and hardware compression and decompression tools cannot achieve without incurring significant expense and complex architectures.

One conventional solution uses a lossless compression algorithm, such as Lempel-Ziv compression algorithms and variable length coding. A conventional architecture for performing such lossless compression can include a unit configured to implement Lempel-Ziv compression followed by another unit configured to implement variable length coding. Some Lempel-Ziv compression algorithm solutions include a hash module, a module for resolving collision chains, and a module for performing longest match searches. Some Lempel-Ziv compression algorithm solutions also include various units of RAM memory for storing hash data or collision chains data. Variable length coding following Lempel-Ziv compression is used conventionally to maintain superior compression ratios; however conventional compression and decompression solutions involving variable length coding cannot be scaled to achieve 4 GB/s.

Thus, what is needed is a solution for decompression of data at high speeds without the limitations of conventional techniques.

BRIEF DESCRIPTION OF THE DRAWINGS

Various embodiments ("examples") of the invention are disclosed in the following detailed description and the accompanying drawings.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For clarity, technical material that is known in the technical fields related to the examples has not been described in detail to avoid unnecessarily obscuring the description.

The described techniques may be implemented as hardware, firmware, circuitry, software or a combination thereof for purposes of providing computational and processing capabilities. The terms "hard disk drive" and "hard disk" are used interchangeably herein to refer computer-based non-volatile magnetic data storage. As used herein, hard disk-based storage may be implemented in a variety of forms, including, but not limited to Direct Attached Storage (DAS), Network Attached Storage (NAS) and Storage Area Networks (SAN). In some examples, a single apparatus (i.e., device, machine, system, or the like) may include both Flash and hard disk-based storage facilities (e.g., solid state drives (SSD), hard disk drives (HDD), or others). In other words, a single monolithic device having both Flash and hard disk drives may be used. In other examples, multiple, disparate (i.e., separate) storage facilities in different apparatuses may be used. Further, the techniques described herein may be used with any type of digital memory without limitation or restriction. In some examples, the described techniques may be implemented, in whole or in part, as a computer program or application ("application") or as a plug-in, module, or sub-component of another application. If implemented as software, the described techniques may be implemented using various types of programming, development, scripting, or formatting languages, frameworks, syntax, applications, protocols, objects, or techniques, including Java™, Javascript™, Ruby, Rails, C, Objective C, C++, C#, Adobe® Integrated Runtime™ (Adobe® AIR™), ActionScript™, Flex™, Lingo™, Ajax, Perl, COBOL, Fortran, ADA, XML, MXML, HTML, DHTML, XHTML, HTTP, XMPP, and others. Design, publishing, and other types of applications such as Dreamweaver®, Shockwave®, Adobe Flash®, and Fireworks® may also be used to implement the described techniques. The described techniques may be varied and are not limited to the examples or descriptions provided.

The overall system performance of solid state storage may be improved by optimizing decompression rates, using the compression and decompression techniques described herein. Most applications are very sensitive to read latency (i.e., the time it takes to complete a read), but not very sensitive to write latency. Since decompression is in the read path, it is desirable to maintain decompression performance at rates matching the aggregate bandwidth of all Flash chips in the system. On the other hand, since compression is in the write path, it is less important for compression to be performed at such high speeds. Described herein are techniques for compression and decompression of data in solid state storage to achieve decompression performance at rates approximating the aggregate bandwidth of a memory system implementing multiple Flash chips.

Figure 1:
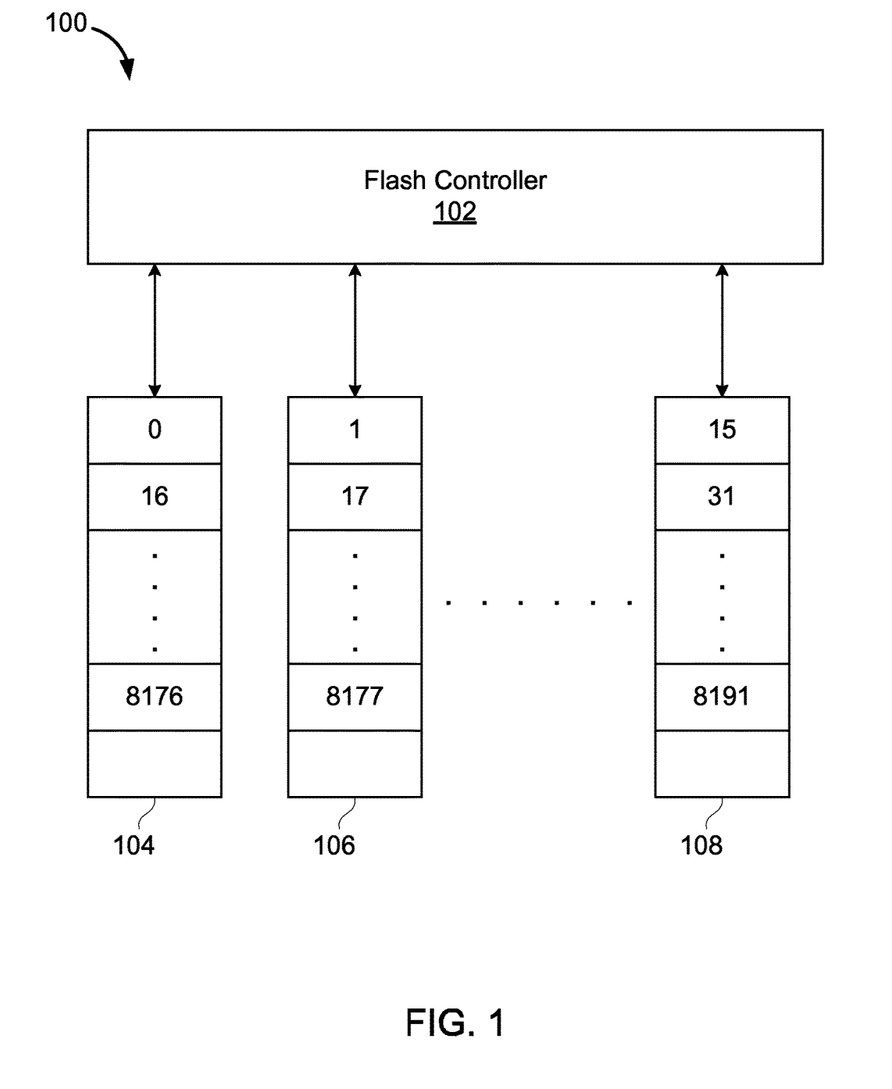
FIG. 1 illustrates an exemplary Flash memory system comprising a plurality of Flash chips.

FIG. 1 illustrates an exemplary Flash memory system comprising a plurality of Flash chips. Here, system 100 includes Flash controller 102 and Flash chips 104-108. In some examples, more or fewer Flash chips may be implemented in system 100, the actual number based on implementation considerations such as cost, power dissipation and available physical space. In an example, an additional thirteen (13) additional Flash chips (not shown) may be implemented between Flash chips 106 and 108, for a total of sixteen (16) Flash chips.

In some examples, each Flash chip may store data in blocks where each block is equal to the size of an Error Correction Code block (hereafter "ECC block"), a block of data over which an error code is computed. Flash memory has fairly high error rates, thus it is essential to have some error correction to reduce the error rate experienced by the end user. The error correction may be block-based, meaning that the error code is computed over an entire block of data and the correction also is done on the entire block. In some examples, the size of an ECC block (hereafter "$N_{ECC}$ bytes"), may be 512 bytes, which matches the industry standard sector size for disks. In other examples, blocks of data may be arranged differently according to different purposes, and also in different sizes. Also, in some examples, each of the Flash chips may be compliant with the Open NAND Flash Interface (ONFI) 2.0 specification, and thus may supply data at rates of approximately 166 MB/s. In other examples, the Flash chips may comply with other specifications.

In some examples, ECC may be done separately for each of Flash chips 104-108, in which case they each may comprise an entire ECC block of data. Thus, each of Flash chips 104-108 may comprise $N_{ECC}$ bytes of data. As shown, the numbers inside each of the Flash chips are exemplary byte addresses. For example, the ECC block of data in Flash chip 104 may comprise bytes 0, 16, 32, and so on through byte 8176 for a total of 512 bytes of data in Flash chip 104. In this example, the ECC block of data in Flash chip 106 may comprise bytes 1, 17, 33, and so on through byte 8177 for a total of 512 bytes of data in Flash chip 106. In this example, the ECC block of data in Flash chip 108 (e.g., the $16^{th}$ Flash chip) may comprise bytes 15, 31, 47, and so on through byte 8191 for a total of 512 bytes of data in Flash chip 108. Since all of the Flash chips may be accessed simultaneously, in an implementation with 16 Flash chips up to 16 ECC blocks of data may be retrieved in a single read operation. In some examples, the data may arrive on a 16-byte wide bus, wherein the first byte from all of the Flash chips arrives in a first clock cycle, the second byte from all of the Flash chips arrives in a second clock cycle, and so on. Thus, in the example shown in FIG. 1, when all 16 Flash chips are read, bytes 0 through 15 arrive in one clock cycle (e.g., each from a separate Flash chip), then bytes 16 through 31 arrive in the next clock cycle, and so on. In other examples, system 100 may be implemented with more or fewer Flash chips.

Figure 2:
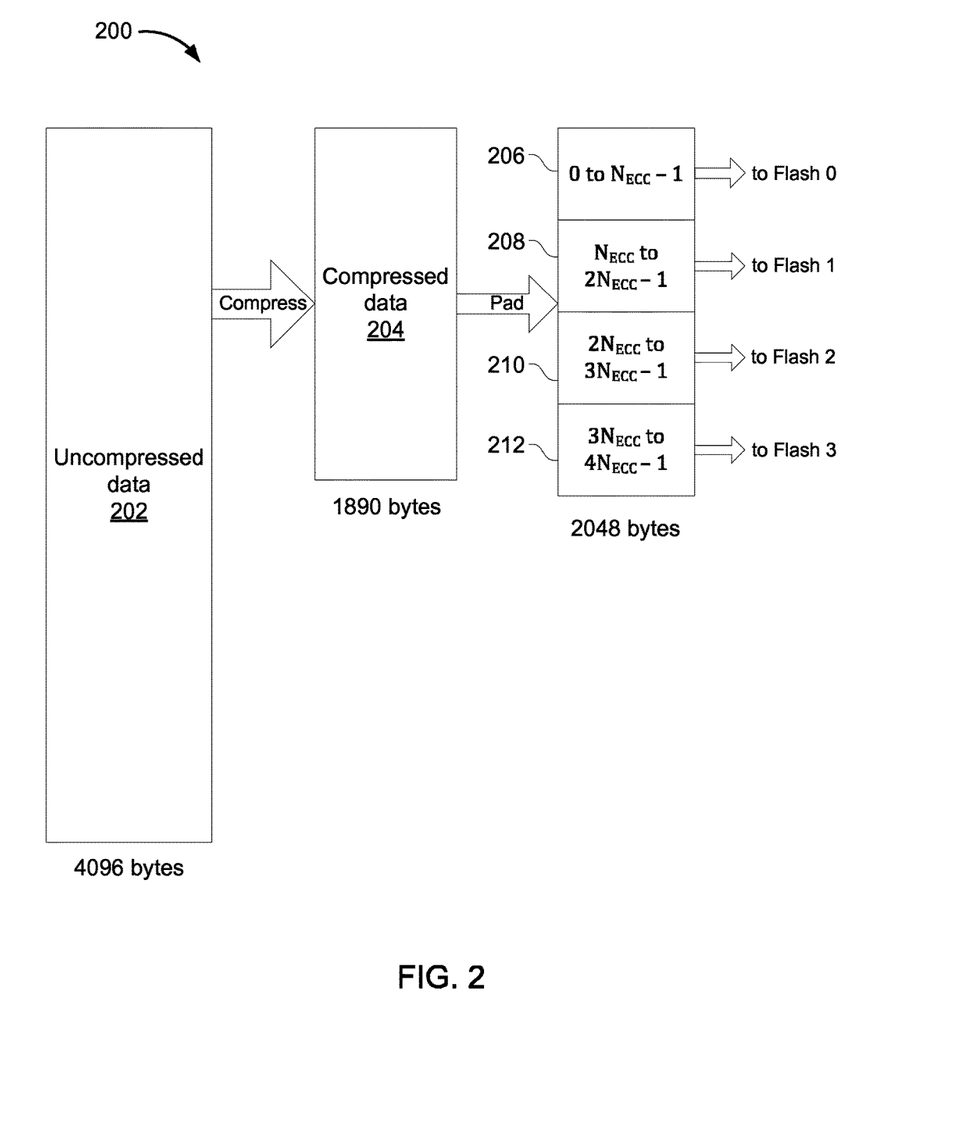
FIG. 2 illustrates an exemplary block diagram showing compression and storage of data in Flash chips.

FIG. 2 illustrates an exemplary block diagram showing compression and storage of data in Flash chips. Here, diagram 200 includes uncompressed data 202, compressed data 204, and blocks 206-212 of padded compressed data. Compression algorithms are broadly classified into two categories: lossless and lossy. Lossless compression generally is designed to reproduce original data more accurately upon decompression. Lossy compression, while less accurate, instead provides higher compression ratios. Since solid state storage is often used for a wide variety of data types, lossless compression is desired for implementing compression of data in solid state storage.

In some examples, lossless compression may be performed using Lempel-Ziv (hereafter "LZ" or "Lempel-Ziv") compression followed by variable length coding. LZ compression may be implemented by finding repeated patterns in data and replacing all but the first occurrence of a pattern with a pointer to the original pattern. As used herein, a byte that is not replaced with a pointer (i.e., the first occurrence of the pattern) is called "a literal," and the pointer information for a string of bytes that have been replaced is called "a match." In some examples, further compression then may be achieved using variable length coding. While each symbol of computer data is described with a fixed length code, which is almost always 8 bits, variable length coding assigns shorter codes to symbols that occur more frequently, and longer codes to symbols that occur less frequently. Encoding data in this manner often leads to an average code length that is less than the original, thus making the data smaller. As described in more detail below, these processes may be reversed during decompression to reconstruct the original data. In other examples, a two-stage compression may be implemented using other compression algorithms, wherein the first stage of decompression is slower relative to the second stage of decompression (e.g., the second stage of compression may be implemented using arithmetic coding instead of variable length coding).

In an example, uncompressed data 202 may comprise 4096 bytes of data. In this example, uncompressed data 202 may be compressed to the size of compressed data 204, which may comprise 1890 bytes. Compressed data 204 then may be padded up to blocks of $N_{ECC}$ bytes to become four blocks of padded compressed data (e.g., blocks 206-212), each comprising $N_{ECC}$ bytes (e.g., 512 bytes) of data. In this example, blocks 206-212 combine for a total of 2048 bytes. In some examples, padding may be implemented by including a particular code to indicate that the rest of the output is padded up to the next ECC block boundary (i.e., the boundary of a block of a predetermined size). The compressor outputs this code when it sees that the output stream is approaching an ECC block boundary and then fills any remaining bits or bytes of the current ECC block with arbitrary data, thereby adding a portion of arbitrary data to the ECC block. In some examples, a compressor (not shown) may be implemented to detect when it is approaching the boundary of an ECC block and will apply padding to complete the ECC block. The compressor may then start the next block with a new variable length code. Thus, in some examples, block 206 may comprise bytes 0 to $N_{ECC}$-1, block 208 may comprise bytes $N_{ECC}$ to $2N_{ECC}$-1, block 210 may comprise bytes $2N_{ECC}$ to $3N_{ECC}$-1, and block 212 may comprise bytes $3N_{ECC}$ to $4N_{ECC}$-1. In other examples, other techniques for padding data encoded by variable length coding may be implemented. In some examples, block 206 then may be written to a first Flash chip (e.g., Flash 0 as shown), block 208 may be written to a second Flash chip (e.g., Flash 1 as shown), block 210 may be written to a third Flash chip (e.g., Flash 2 as shown), and block 212 may be written to a fourth Flash chip (e.g., Flash 3 as shown). A person of ordinary skill in the art will recognize that the sizes described herein are for purposes of illustration only, and that the actual sizes of uncompressed and compressed data may vary, and thus also the number of Flash chips used, depending on the nature of the data and the implementation of the compressor. As shown, the compression technique displayed in diagram 200 serves to arrange compressed output data in a fashion that makes it possible to decompress at a faster rate.

Figure 3:
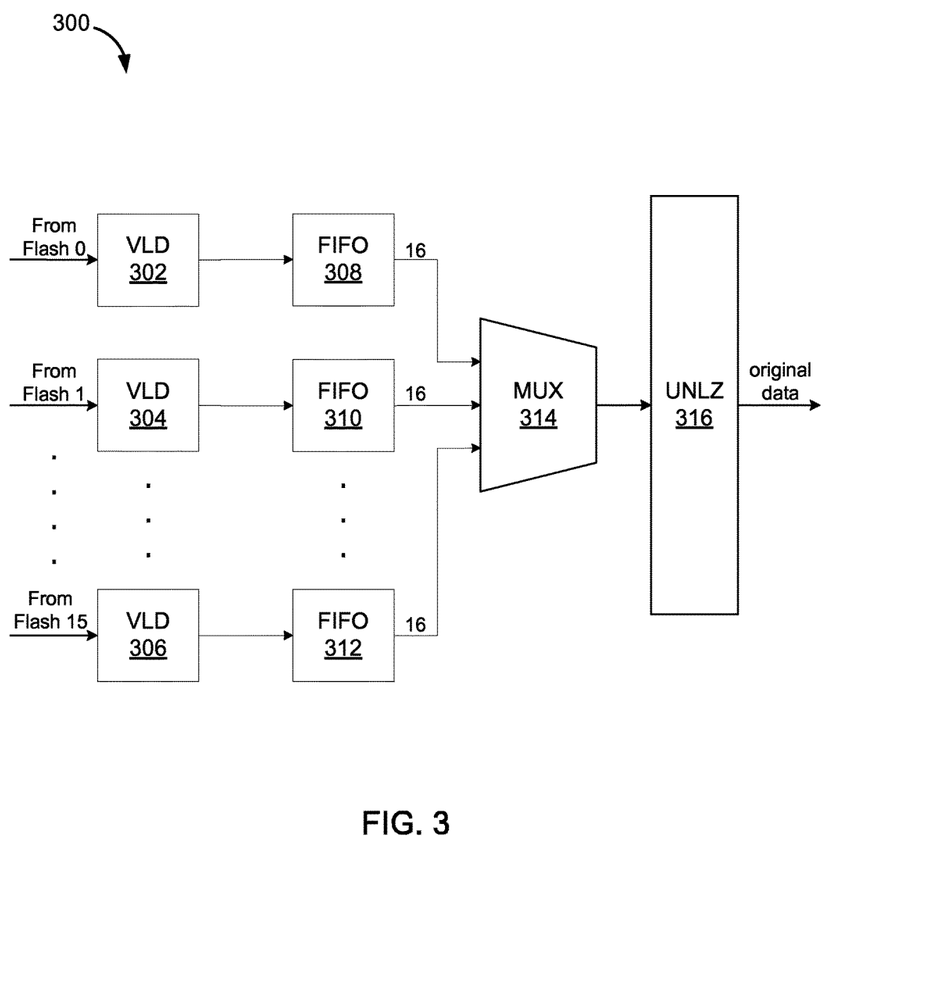
FIG. 3 illustrates an exemplary decompressor system for decompression of data stored in Flash chips to reconstruct original data.

FIG. 3 illustrates an exemplary decompressor system for decompression of data stored in Flash chips to reconstruct original data. Here, system 300 includes Variable Length Decoders (VLDs) 302-304, First-In-First-Out circuits (FIFOs) 308-312, multiplexer (MUX) 314, and reverse LZ unit (hereafter "UNLZ") 316. As shown here, for each Flash chip (e.g., Flash 0, Flash 1 through Flash 15, etc.), there may be a separate VLD. In some examples, when a particular block of compressed data needs to be accessed, all of the ECC blocks (e.g., comprising $N_{ECC}$ bytes) that were a part of that compressed block may be accessed simultaneously and each VLD may decode the ECC block retrieved from the Flash chip with which it is associated. Since it is desirable that no variable length code be split across ECC block boundaries, the technique of padding described above in FIG. 2 may be implemented so that each VLDs has the full information required to decode a variable length code (i.e., that no variable length code is split such that part of it is output to one VLD and the rest to another VLD). In some examples, there is a VLD for each Flash chip. In this first stage of decompression, each VLD may decode compressed data from an associated Flash chip. For example, as shown, a variable length code from Flash 0 may be decoded by VLD 302, another variable length code from Flash 1 may be decoded by VLD 304, and so on through VLD 306, which receives and decodes a variable length code from Flash 15. In some examples, the output from VLDs 302-306 may comprise literals and matches. In the case of a match, the VLD may function to pad the match information with additional bytes, where necessary, such that the total space occupied by the match and the pad bytes equals the length of the original string. For example, if a string of 7 bytes from Flash 0 was found during compression to have a match with an earlier occurrence of 7 bytes, and if that match information comprised a 2 byte backwards distance identifying the previous occurrence with a 1 byte length, the match information thus comprising 3 bytes. In some examples, VLD 302 may pad the string with 4 bytes of arbitrary data so that the code is 7 bytes, to match the length of the replaced string. In another example, if the length of the matched string were 8 bytes, also with a 2 byte backwards distance and a 1 byte length, the arbitrary data portion would be 5 bytes. In some examples, VLD 302 also may generate a 1 bit flag for each byte to assist UNLZ 316 with identifying whether a particular byte is a literal or part of a match. For example, one value of a flag (e.g., 0) may indicate a literal and another value (e.g., 1) may indicate a match. VLD 304 and VLD 306 may function similarly to VLD 302 with respect to data from Flash 1 and Flash 15, respectively.

In some examples, the output of each of VLD 302-306 may be provided to an associated FIFO. For example, FIFO 308 may be associated with VLD 302 and receive VLD 302's output, FIFO 310 may be associated with VLD 304 and receive VLD 304's output and so on through to FIFO 312, which receives VLD 306's output. In some examples, FIFO 308-312 may be configured so that its input is written one byte at a time, and its output is read 16 bytes at a time. A person of ordinary skill in the art will recognize that system 300 may be implemented such that different numbers of bytes may be written to, or read from, FIFO 308-312, based upon implementation considerations. Reading multiple bytes in parallel from FIFO 308-312 allows the second stage of decompression (e.g., reverse LZ compression, described below) to run faster.

In some examples, UNLZ 316 may read data from FIFOs 308-312, and all FIFOs in between, which are associated with Flash 0-15, respectively, each of which may comprise $N_{ECC}$ bytes of compressed data. In some examples, UNLZ 316 may receive this data via MUX 314, and it may read 16 bytes in a single clock cycle. For example, MUX 314 may process data output from FIFO 308 (e.g., 16 bytes at time), then process data output from FIFO 310, and so on through FIFO 312, and then output data (e.g., in order) to UNLZ 316. In some examples, UNLZ 316 may decompress data from FIFO 308 first, then decompress data from FIFO 310, and so on until an entire block of data is decompressed. In some examples, such a block of data may not use all 16 FIFOs (e.g., does not use VLDs and Flash chips). In other examples, system 300 may be implemented with more or fewer Flash chips, VLD units and FIFO units.

In some examples, UNLZ 316 may examine the flag for each byte to determine if it is a literal or a match. For example, if the byte is a literal, UNLZ 316 may simply pass the data through as original data, or part of original data. If, in another example, the byte is the start of a match, then UNLZ 316 may reconstruct the original data associated with that string by reading the length and the backward distance of the match, retrieving the previous occurrence of the matching string suing the backward distance, and replacing the appropriate number of bytes according to data from the matching string.

As mentioned above, UNLZ 316 may operate on 16 bytes in a single clock cycle. In some examples, a span of 16 bytes may include multiple matches. In such examples, UNLZ 316 may operate to replace all of the matches in the 16-byte span in a single clock cycle. In some examples, a minimum length of matches may be four (4) bytes. In such an example, a 16-byte span may have up to 4 matches, if the span begins with the start of a match. Since a match may start on any byte, in another example, a 16-byte span may comprise three (3) complete matches and portions of two (2) additional matches. In some examples, to enable this flexibility, a memory used to store previous bytes must be operable to conduct at least five (5) lookups in a single clock cycle, for example if each match has a different backward distance. For example, the memory may be implemented as a multi-ported memory with 5 read ports and 1 write port. Alternatively, multiple memories (e.g., 5) may be implemented, each comprising 1 of 5 copies of the same data, each with 1 write port and 1 read port. A person of ordinary skill in the art will understand that the maximum number of matches may depend on a given implementation and compression process, and that other implementations may require more or fewer ports, for example, depending on the compression hardware.

In some examples, UNLZ 316 may operate at a clock frequency of 250 MHz, thus yielding a peak performance of 4 GB/s, when processing 16 bytes per clock cycle. In other examples, UNLZ 316 may operate faster or slower, depending on the processing technology used, yielding higher or lower performance. In still other examples, system 300 may be implemented with more or fewer components.

Figure 4:
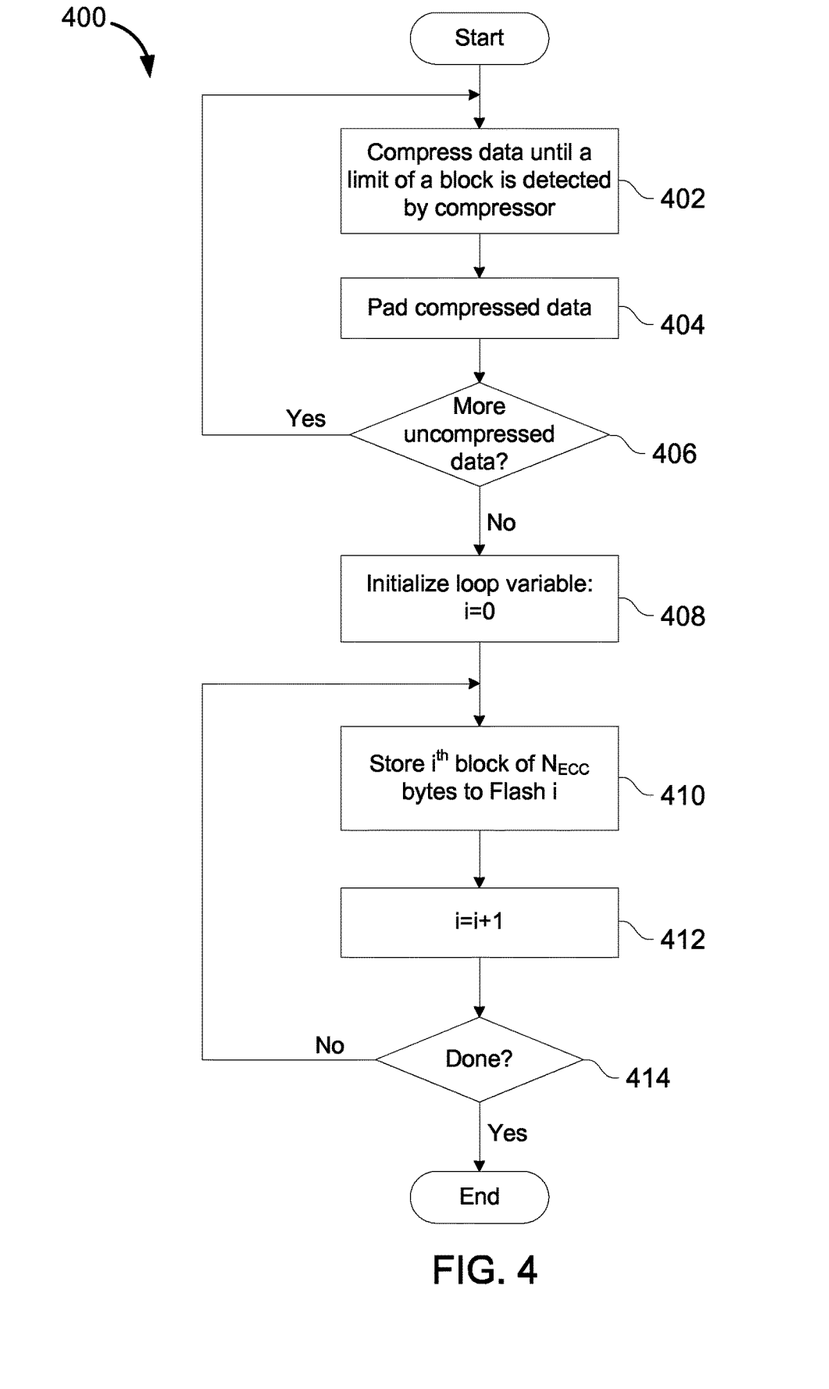
FIG. 4 illustrates an exemplary process for compression and storage of data in Flash chips to enable two-stage decompression.

FIG. 4 illustrates an exemplary process for compression and storage of data in Flash chips to enable two-stage decompression. Here, process 400 may begin with compressing data until a limit of a block is detected by a compressor (402). The limit of the block may be associated with a predetermined block size (e.g., $N_{ECC}$ bytes). Then, in some examples, the compressed data may be padded (404) up to the predetermined block size (e.g., padding up to $N_{ECC}$ bytes, as described above re FIG. 2). Once a block of compressed data is padded, a determination may be made whether there is more uncompressed data to process (i.e., a remaining uncompressed portion of data) (406). If yes, then the compressor continues to compress and pad the uncompressed data into blocks of the predetermined block size. If no, then a loop variable (e.g., i) is initialized (e.g., i=0) (408). As shown, an $i^{th}$ (e.g., $0^{th}$) block of the predetermined block size, then may be stored to a Flash chip designated Flash i (e.g., Flash 0) (410). After an $i^{th}$ block of data is stored in a Flash chip, the loop variable may be advanced (e.g., i=i+1) (412), and then a determination made whether the system is done storing data (e.g., whether there is more compressed data to store) (414). If the system is not done storing data, then the next $i^{th}$ block of data (e.g., i=1) may be stored to the next Flash i (e.g., Flash 1), and so on. If the system is done storing data (e.g., there is no more compressed data to store), then process 400 ends.

Figure 5:
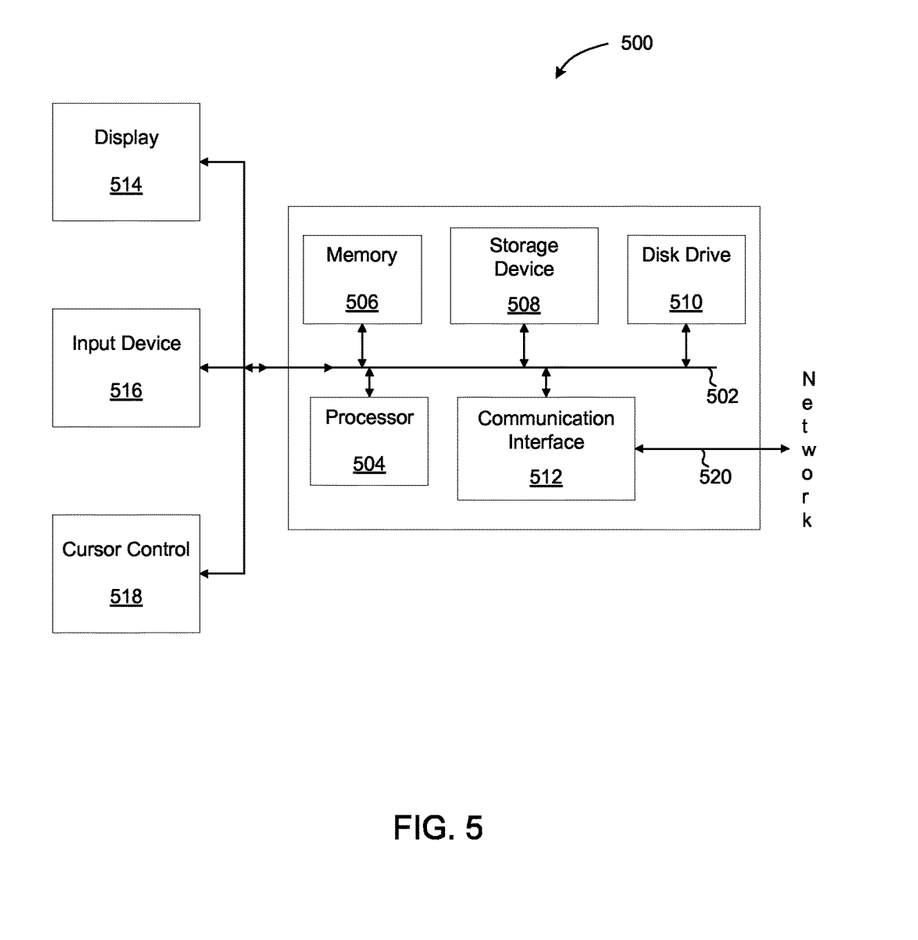
FIG. 5 illustrates an exemplary computer system suitable for implementing compression and decompression of data at high speed in solid state storage.

FIG. 5 illustrates an exemplary computer system suitable for implementing compression and decompression of data at high speed in solid state storage. In some examples, computer system 500 may implement computer programs, applications, methods, processes, or other software or hardware to perform the above-described techniques. Computer system 500 includes a bus 502 or other communication mechanism for communicating information, which interconnects subsystems and devices, such as processor 504, system memory 506 (e.g., RAM), storage device 508 (e.g., Flash, ROM, etc.), disk drive 510 (e.g., magnetic or optical), communication interface 512 (e.g., modem or Ethernet card), display 514 (e.g., CRT or LCD), input device 516 (e.g., keyboard), and cursor control 518 (e.g., mouse or trackball).

According to some examples, computer system 500 performs specific operations by processor 504 executing one or more sequences of one or more instructions stored in system memory 506. Such instructions may be read into system memory 506 from another computer readable medium, such as static storage device 508 or disk drive 510. In some examples, hard-wired circuitry may be used in place of or in combination with software instructions for implementation.

The term "computer readable medium" refers to any tangible medium that participates in providing instructions to processor 504 for execution. Such a medium may take many forms, including but not limited to, non-volatile media and volatile media. Non-volatile media includes, for example, optical or magnetic disks, such as disk drive 510. Volatile media includes dynamic memory, such as system memory 506.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

Instructions may further be transmitted or received using a transmission medium. The term "transmission medium" may include any tangible or intangible medium that is capable of storing, encoding or carrying instructions for execution by the machine, and includes digital or analog communications signals or other intangible medium to facilitate communication of such instructions. Transmission media includes coaxial cables, copper wire, and fiber optics, including wires that comprise bus 502 for transmitting a computer data signal.

In some examples, execution of the sequences of instructions may be performed by a single computer system 500. According to some examples, two or more computer systems 500 coupled by communication link 520 (e.g., LAN, PSTN, or wireless network) may perform the sequence of instructions in coordination with one another. Computer system 500 may transmit and receive messages, data, and instructions, including program, i.e., application code, through communication link 520 and communication interface 512. Received program code may be executed by processor 504 as it is received, and/or stored in disk drive 510, or other non-volatile storage for later execution.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method, comprising:
receiving a plurality of blocks of compressed data from a plurality of corresponding nonvolatile memory ("NVM") chips, wherein the plurality of corresponding NVM chips includes sixteen (16) flash memory chips organized into multiple storage blocks;
decompressing least two of the plurality of blocks of the compressed data approximately concurrently by at least two of a plurality of decoders in a first stage of decompression to produce a plurality of partially decompressed blocks; and
reconstructing an original data from the partially decompressed blocks in a second stage of decompression via a multiplexing operation, wherein the second stage of decompression uses a decompression unit being configured to operate at a clock frequency of at least 250 MHz,
wherein the decompressing at least two of the plurality of blocks of the compressed data includes decompressing the plurality of blocks of the compressed data substantial concurrently utilizing a plurality of variable length decoders, each of the plurality of variable length decoders associated with a Flash memory chip being configured to store at least one of the plurality of blocks.

2. The method of claim 1, further comprising writing one of the plurality of partially decompressed blocks to a FIFO associated with one of the plurality of variable length decoders.

3. The method of claim 2, wherein the one of the plurality of partially decompressed blocks is written to the FIFO in one byte increments.

4. The method of claim 1, wherein the second stage of decompression uses a decompression unit being configured to reverse Lempel-Ziv compression.

5. The method of claim 4, wherein the decompression unit is configured to examine a flag to determine whether a byte of data is a literal or a match.

6. The method of claim 5, wherein the decompression unit is configured to reconstruct the original data using the length and backward distance of the match.

7. The method of claim 1, wherein the first stage of decompression is slower titan the second stage of decompression, wherein each block in the first stage of decompression processes a proximate 1 byte in a single clock cycle and the second stage processes a proximate 16 bytes in a single clock cycle.

8. The method of claim 1, wherein the second stage of decompression uses a decompression unit being configured to process a proximate 16 bytes per clock cycle.

9. A memory system capable of storing data persistently, comprising:
a plurality of nonvolatile memory ("NVM") chips capable of storing data persistently, wherein each of the plurality of NVM chips is organized into multiple blocks, the plurality of NVM chips configured to store compressed data across multiple blocks situated in different NVM chips;
a plurality of decoders coupled to the plurality of NVM chips via a plurality of buses wherein each of the plurality of decoders, coupled to a designated NVM chip, is able to decompress a block of compressed data received from the designated NVM chip to generate a block of partially decompressed data; and
a multiplexer coupled to the plurality of decoders and able to restore data from at least two blocks of partially decompressed data generated by different decoders,
wherein the plurality of NVM chips includes sixteen (16) flash memory chips organized into multiple storage blocks.

10. The system of claim 9, further comprising a plurality of buffers coupled to the plurality of decoders and configured to temporary buffer the partially decompressed data generated by the plurality of decoders.

11. The system of claim 10, wherein each of the plurality of buffers includes an input and an output wherein the input is coupled to a decoder output of one of the plurality of decoders and the output is coupled to a multiplexer input of the multiplexer.

12. The system of claim 9, further comprising a reverse Lempel-Ziv unit coupled to the multiplexer for providing decompressed data which is substantially similar to original data.

13. The system of claim 9, wherein the plurality of decoders includes sixteen (16) variable length decoders ("VLDs") wherein each of the sixteen (16) VLDs is dedicated to one of the sixteen (16) flash memory chips via a connection for providing a first stage of decompression.

14. The system of claim 13, further includes sixteen (16) first-in-first-out circuits ("FIFOs") situated between the sixteen (16) VLDs and the multiplexer for providing temporarily storage.

15. The system of claim 14, wherein the multiplexer is configured to receive sixteen (16) outputs from sixteen (16) FIFOs for providing a second stage of decompression.

16. The system of claim 15, wherein each block in the first stage of decompression processes a proximate 1 byte in single clock cycle.

17. The system of claim 15, wherein the second stage of decompression processes a proximate 16 bytes in a single clock cycle.

18. The system of claim 13, wherein the sixteen (16) VLDs are configured to reconstruct the original data using the length and backward distance of the match.

* * * * *